United States Patent [19]
Kawachi

[11] Patent Number: 5,559,344
[45] Date of Patent: Sep. 24, 1996

[54] THIN-FILM SEMICONDUCTOR ELEMENT, THIN-FILM SEMICONDUCTOR DEVICE AND METHODS OF FABRICATING THE SAME

[75] Inventor: Genshiro Kawachi, Hitachi, Japan

[73] Assignee: Hitachi, Ltd., Tokyo, Japan

[21] Appl. No.: 8,359

[22] Filed: Jan. 22, 1993

[30] Foreign Application Priority Data

Jan. 31, 1992 [JP] Japan ................................. 4-016672
Mar. 23, 1992 [JP] Japan ................................. 4-065040

[51] Int. Cl.⁶ ........................................ H01L 29/04
[52] U.S. Cl. ........................ 257/57; 257/59; 257/63
[58] Field of Search ........................... 257/59, 57, 60, 257/61, 69, 72, 66, 63

[56] References Cited

U.S. PATENT DOCUMENTS

| | | | |
|---|---|---|---|
| 4,555,721 | 11/1985 | Bansal et al. | 257/69 |
| 4,720,736 | 1/1988 | Takafuji et al. | 257/60 |
| 5,047,360 | 9/1991 | Nicholas | 437/40 |
| 5,070,379 | 12/1991 | Nomoto et al. | 257/59 |
| 5,114,869 | 5/1992 | Tanaka et al. | 257/57 |

FOREIGN PATENT DOCUMENTS

| | | | |
|---|---|---|---|
| 58-90783 | 5/1983 | Japan | 257/57 |
| 60-154660 | 8/1985 | Japan . | |
| 63-9157 | 1/1988 | Japan . | |
| 1-227127 | 9/1989 | Japan . | |
| 1-302769 | 12/1989 | Japan . | |
| 2-116173 | 4/1990 | Japan | 257/61 |
| 2-199824 | 8/1990 | Japan . | |

*Primary Examiner*—Sara W. Crane
*Assistant Examiner*—Courtney A. Bowers
*Attorney, Agent, or Firm*—Antonelli, Terry, Stout & Kraus

[57] ABSTRACT

A thin-film semiconductor device includes a plurality of thin-film semiconductor elements each having a gate electrode formed on a substrate, an insulating film formed on the gate electrode, a semiconductor film formed on the insulating film and doped with an n-type impurity, and source and drain electrodes formed on the semiconductor film and separated from each other, that region of the semiconductor film which corresponds to a gap between the source electrode and the drain electrode, being doped with a p-type impurity so that the p-type impurity concentration is equal to or greater than the n-type impurity concentration, to form an intrinsic layer, scanning-signal transmitting electrode lines each formed so as to connect the gate electrodes of some of the thin-film semiconductor elements, video-signal transmitting electrode lines each formed so as to connect the drain electrodes of some of the thin-film semiconductor elements, and pixel electrodes each connected to the source electrode of one of the thin-film semiconductor elements. Preferably, the n-type impurity concentration and p-type impurity concentration in that region of the semiconductor film which corresponds to a gap between the source electrode and the drain electrode, decrease exponentially with the depth from the surface of the region, to obtain a thin-film semiconductor device having excellent characteristics.

28 Claims, 12 Drawing Sheets

XXVIII – XXVIII

XXIX – XXIX

THIN-FILM SEMICONDUCTOR ELEMENT, THIN-FILM SEMICONDUCTOR DEVICE AND METHODS OF FABRICATING THE SAME

BACKGROUND OF THE INVENTION

The present invention relates to a thin-film semiconductor element, a thin-film semiconductor device, and methods of fabricating the element and device, and more particularly to a thin-film semiconductor element and a thin-film semiconductor device which are used for the driving device of a liquid crystal display device or the like, and to methods of fabricating the element and device.

A thin-film transistor (hereinafter referred to as "TFT") formed on an insulating substrate such as a glass substrate has hitherto been applied to a liquid crystal flat panel display device of the active matrix type and a line image sensor for facsimile, and the improvement of the TFT has been promoted in various fields. A TFT using amorphous silicon is now widely used to form the liquid crystal display device and the line images sensor, since the above TFT having a large area can be readily produced at low temperatures.

Examples of the technology concerning a TFT have been described in Japanese Patent Applications JP-A-63-9,157 and JP-A-1-302,769. The above-referred patent application JP-A-63-9,157 discloses a method of fabricating a TFT. According to the invention disclosed in this patent application, the number of etching steps is reduced, so that the quality of the fabricated TFT is improved, and a step of positioning source and drain electrodes which are to be accurately located, is omitted. Further, the patent application JP-A-1-302,769 discloses a method of fabricating a TFT. According to the invention disclosed in this patent application, a gate electrode and a gate insulating film are successively formed on a substrate by the well-known method. Further, an intrinsic semiconductor film and an n-type semiconductor film are successively formed on the gate insulating film by the CVD method, source and drain electrodes are formed on the n-type semiconductor film so that the source electrode and the drain electrode are separated from each other. Then, that region of the n-type semiconductor film which corresponds to a gap between the source electrode and the drain electrode, is doped with a p-type impurity, to make this region intrinsic. It is noted that the n-type semiconductor film is formed by the CVD method.

SUMMARY OF THE INVENTION

When an n-type semiconductor film is formed by the CVD method as mentioned above, the n-type impurity concentration in the semiconductor film is constant along the direction of depth. In order to make the n-type semiconductor film intrinsic after the n-type semiconductor film has been formed by the CVD method, it is necessary to implant a p-type impurity in the n-type semiconductor film so that the p-type impurity concentration in the semiconductor film is equal to the n-type impurity concentration therein. When the p-type impurity is implanted in the semiconductor film by the ion implantation method or the ion doping method, it is impossible to make the p-type impurity concentration constant in the semiconductor film. Further, the n-type semiconductor film usually has a thickness of about 50 nm. In order to make this n-type semiconductor film instrinsic, it is necessary to bombard the semiconductor film with the p-type impurity having at least an energy of 20 to 30 KeV.

However, when the semiconductor film is bombarded with the p-type, impurity having such high energy, a channel layer where carriers travel, is damaged by the high-energy impurity, and thus the characteristics of the TFT using the above semiconductor film are degraded.

The present invention has been made to solve the above problem, and it is an object of the present invention to provide a thin-film semiconductor element and a thin-film semiconductor device, in which a semiconductor film is made intrinsic by making the p-type impurity concentration in the semiconductor film equal to the n-type impurity concentration therein and moreover a channel layer suffers no damage to enhance the reliability of the element and the device, and to provide methods of fabricating the thin-film semiconductor element and the thin-film semiconductor device.

According to the first aspect of the present invention, there is provided a thin-film semiconductor element which comprises: a gate electrode formed on an insulating substrate; an insulating film formed on the gate electrode; a semiconductor film formed on the insulating film and doped with an n-type impurity; and source and drain electrodes formed on the semiconductor film and separated from each other, that region of the semiconductor film which corresponds to a gap between the source electrode and the drain electrode, being doped with a p-type impurity so that the p-type impurity concentration is equal to or greater than the n-type impurity concentration, to form an intrinsic layer.

In the above thin-film semiconductor element, it is preferable that the n-type impurity concentration and p-type impurity concentration in the semiconductor film decrease exponentially with the depth from the surface of the semiconductor film.

Further, in the thin-film semiconductor element, the thickness of the semiconductor film lies in a range from 20 to 100 nm, and the semiconductor film is made of a material selected from a group consisting of amorphous Si, amorphous SiGe, amorphous Ge, amorphous SiN, amorphous SiC and amorphous SiSn.

According to the second aspect of the present invention, there is provided a thin-film semiconductor device using the above thin-film semiconductor element. The thin-film semiconductor device comprises: a plurality of thin-film semiconductor elements each having one of a plurality of gate electrodes which are formed on a transparent insulating substrate in the form of a matrix, an insulating film formed on the gate electrode, a semiconductor film formed on the insulating film and doped with an n-type impurity, and source and drain electrodes formed on the semiconductor film and separated from each other, that region of the semiconductor film which correspond to a gap between the source electrode and the drain electrode, being doped with a p-type impurity so that the p-type impurity concentration is equal to or greater than the n-type impurity concentration, to form an intrinsic layer; scanning-signal transmitting electrode lines each formed so as to connect the gate electrodes of some of the thin-film semiconductor elements; video-signal transmitting electrode lines each formed so as to connect the drain electrodes of some of the thin-film semiconductor elements; and pixel electrodes each connected to the source electrode of one of the thin-film semiconductor elements.

According to the third aspect of the present invention, there is provided a thin-film semiconductor device, in which the pixel electrode of the thin-film semiconductor device according to the second aspect of the present invention is replaced by a photoconductor, that is, the photoconductor is connected to the source electrode of one of the thin-film semiconductor elements. In more detail, a thin-film semiconductor device according to the third aspect of the present invention comprises: a plurality of thin-film semiconductor elements each having one of a plurality of gate electrodes which are formed on a transparent insulating substrate in the form of a matrix, an insulating film formed on the gate electrode, a semiconductor film formed on the insulating film and doped with an n-type impurity, and source and drain electrodes formed on the semiconductor film and separated from each other, that region of the semiconductor film which corresponds to a gap between the source electrode and the drain electrode, being doped with a p-type impurity so that the p-type impurity concentration is equal to or greater than the n-type impurity concentration, to form an intrinsic layer; scanning-signal transmitting electrode lines each formed so as to connect the gate electrodes of some of the thin-film semiconductor elements; video-signal transmitting electrode lines each formed so as to connect the drain electrodes of some of the thin-film semiconductor elements; and photoconductors each connected to the source electrode of one of the thin-film semiconductor elements.

According to the fourth aspect of the present invention, there is provided a thin-film semiconductor device, in which the semiconductor film of the thin-film semiconductor device according to the second aspect of the present invention also lies under the video-signal transmitting line. In more detail, a thin-film semiconductor device according to the fourth aspect of the present invention comprises: scanning-signal transmitting electrode lines and video-signal transmitting electrode lines arranged on a transparent insulating substrate in the form of a lattice, the scanning signal transmitting electrode lines being insulated from the video-signal transmitting electrode lines by an insulating film; pixel electrodes arranged at the crossing parts of the scanning-signal transmitting electrode lines and the video-signal transmitting electrode lines; and thin-film semiconductor elements arranged at the crossing parts of the scanning-signal transmitting electrode lines and the video-signal transmitting electrode lines, each thin-film semiconductor element having a gate electrode connected to a scanning-signal transmitting electrode line, an insulating layer formed on the gate electrode, a semiconductor film formed on the insulating layer and doped with an n-type impurity, and source and drain electrodes formed on the semiconductor film and separated from each other, the semiconductor film being extended under a video-signal transmitting electrode line so that the extended portion of the semiconductor film and the video-signal transmitting electrode line have the same pattern, the drain electrode being connected to a video-signal transmitting electrode line, the source electrode being connected to a pixel electrode, that region of the semiconductor film which corresponds to a gap between the source electrode and the drain electrode, being doped with a p-type impurity so that the p-type impurity concentration is equal to or greater than the n-type impurity concentration, to form an intrinsic layer.

According to the fifth aspect of the present invention, there is provided a method of fabricating a thin-film semiconductor element which method comprises the steps of: forming a gate electrode on a transparent insulating substrate; forming an insulating film on the gate electrode; forming a semiconductor film on the insulating film; doping the semiconductor film with an n-type impurity; forming source and drain electrodes on the semiconductor film so that the source electrode and the drain electrode are separated from each other; and doping that region of the semiconductor film which corresponds to a gap between the source electrode and the drain electrode, with a p-type impurity so that the p-type impurity concentration is equal to or greater than the n-type impurity concentration, to form an intrinsic layer.

In the above method of fabricating a thin-film semiconductor element, when the semiconductor film is doped with the n-type impurity or p-type impurity, an ion beam is used which contains the n-type impurity or p-type impurity and is not subjected to mass separation. Further, ions contained in this ion beam are accelerated at an accelerating voltage equal to or less than 2,500 eV.

According to the sixth aspect of the present invention, there is provided a method of fabricating a thin-film semiconductor device which uses the above-mentioned thin-film semiconductor element. The method according to the sixth aspect of the present invention comprises the steps of: forming a plurality of gate electrodes on a transparent insulating substrate in the form of a matrix and forming scanning-signal transmitting electrode lines on the substrate, each scanning-signal transmitting electrode line being formed so as to connect some of the gate electrodes; forming a first insulating film on each of the gate electrodes; forming a semiconductor film on the first insulating film; doping the semiconductor film with an n-type impurity; forming source and drain electrodes on the semiconductor film so that the source electrode and the drain electrode are separated from each other, and forming pixel electrodes and video-signal transmitting electrode lines, each of the pixel electrodes being connected with one of a plurality of source electrodes, each of the video-signal transmitting electrode lines being formed so as to connect some of a plurality of drain electrodes; doping that region of the semiconductor film which corresponds to a gap between a pair of source and drain electrodes, and other exposed regions of the semiconductor film, with a p-type impurity so that the p-type impurity concentration is equal to or greater than the n-type impurity concentration, to form an intrinsic layer; forming a second insulating film on a surface which includes intrinsic layer the source electrodes, the drain electrodes, the scanning-signal transmitting electrode lines, the video-signal transmitting electrode lines and the pixel electrodes; and subjecting the intrinsic layers to patterning by using the second insulating film, the source electrodes and the drain electrodes as a mask.

According to the above-mentioned thin-film semiconductor element, thin-film semiconductor devices and fabrication methods, a semiconductor film is doped with an n-type impurity, and then that region of semiconductor film which correspond to a gap between a source electrode and a drain electrode, is doped with a p-type impurity so that the p-type impurity concentration is equal to the n-type impurity concentration. That is, the conventional etching for the n-type semiconductor film is unnecessary, and the semiconductor film can be made thin. Thus, the manufacturing yield of the semiconductor film is improved, a time necessary for forming the semiconductor film is shortened, the throughput in forming the semiconductor film is improved, and the manufacturing cost of the semiconductor film is reduced.

Further, both of the n-type and the p-type impurities are doped by using ion-doping method in low-energy ion beam.

Accordingly, the p-type impurity can be made equal concentration to the n-type impurity without damaging the channel layer. Thus, the characteristics of the thin-film semiconductor element are never degraded.

Further, when the impurity concentration in the semiconductor film is decreased exponentially with the depth from the surface of the semiconductor film, and the thickness of the semiconductor film is put in a range from 20 to 100 nm, the impurity concentration in that part of the semiconductor film which is put in contact with one of the source and drain electrodes, is sufficiently large, but the impurity concentration in that part of the semiconductor film which is near to the interface between the semiconductor film and a gate insulating film, is so small that an n-type impurity-p-type impurity complex defects will not be generated in the latter part. Accordingly, the thin-film semiconductor element will have excellent characteristics.

In the thin-film semiconductor device using the above thin-film semiconductor element, the OFF-resistance of TFT can be increased, and thus a display device using this thin-film semiconductor device can display a high quality image.

Further, not only the above thin-film semiconductor device is used at the TFT active matrix panel of a liquid crystal display device, but also the thin-film semiconductor device can be used as the TFT active matrix panel of a line image sensor for reading a picture image by replacing the pixel electrode by a photoconductor.

In the case that the pixel electrode is equivalent to a transparent electrode, when the transparent electrode is irradiated with an ion beam which is not subjected to mass separation, especially with an ion beam containing hydrogen, the transparency is lost. However, when the transparent electrode is protected by an insulating film such as an $SiO_2$ film, the degradation of the transparent electrode is prevented. Accordingly, the pixel electrode formed of the transparent electrode is disposed under the gate insulating film. That is, when the p-type impurity is implanted in the semiconductor film, the damage to the pixel electrode caused by the ion beam is prevented by the gate insulating film.

DESCRIPTION OF THE PREFERRED EMBODIMENTS

Embodiments of the present invention will be explained below, with reference to the drawings.

Figure 1:
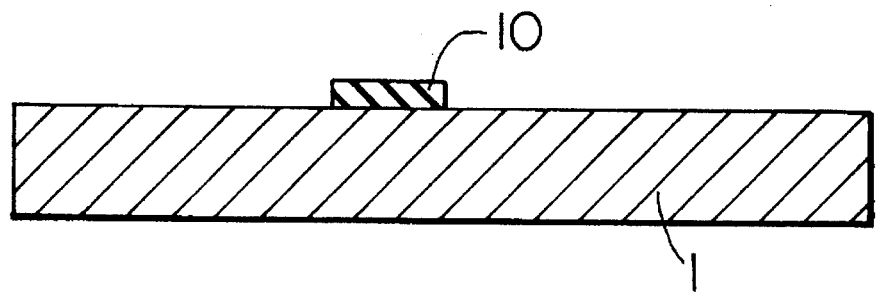
FIG. 1 is a sectional view showing a step of forming the gate electrode of a thin-film semiconductor element according to the present invention.
Figure 2:
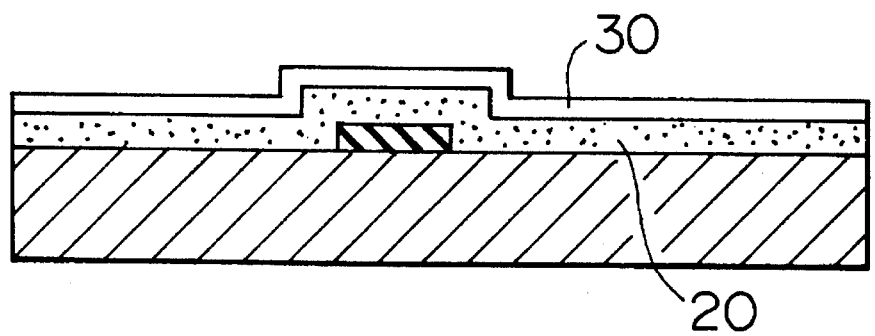
FIG. 2 is a sectional view showing a step of forming a gate insulating film on the gate electrode of FIG. 1 and forming a semiconductor film on the gate insulating film.
Figure 3:
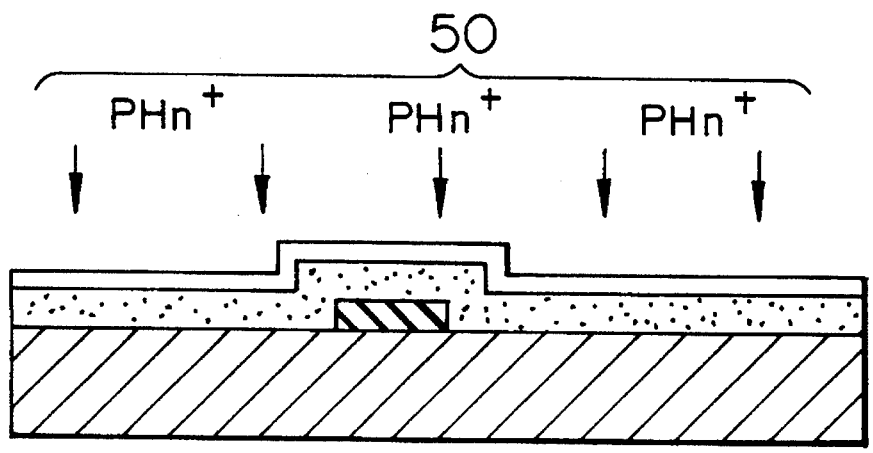
FIG. 3 is a sectional view showing a step of doping the semiconductor film of FIG. 2 with an n-type impurity.

FIGS. 1 to 6 are sectional views showing the fabrication process of a thin-film semiconductor element according to the first embodiment of the present invention. Referring to FIG. 1, chromium is deposited on a glass substrate 1 by the sputtering method, and the chromium film thus obtained is subjected to patterning to form a gate electrode 10. Then, as shown in FIG. 2, a silicon nitride (SiN) film 20 having a thickness of 400 nm and a hydrogenated amorphous silicon ($\alpha$-Si:H) film 30 having a thickness of 60 nm are successively formed by the plasma CVD method. Next, as shown in FIG. 3, ion implantation is carried out by using a large-diameter ion beam which is extracted from the plasma of phosphine ($PH_3$) gas, contains ions such as $P^+$, $PH^+$ and $PH_2^+$, and is accelerated at a voltage of 1.0 kV. That is, the silicon film 30 is bombarded with the ion beam so that the ions are incident on the silicon film 30 at a dose rate of $5\times10^{15}$ $cm^{-2}$, while keeping the substrate 1 at a temperature of about 200° C. Then, the hydrogenated amorphous silicon film 30 is subjected to patterning to have a predetermined shape.

In order to bombard the silicon film with an ion beam which has such low energy and is not subjected to mass separation, a magnetic bucket type ion source can be used, as described in a Japanese Patent Application JP-A-2-199,824. Further, Japanese Patent Application JP-A-63-234,519 discloses an ion implantation method using an rf-plasma type ion source. Now, let us compare the magnetic bucket type ion source with the rf-plasma type ion source. The magnetic bucket type ion source has a feature that an ion beam having a large current value can be obtained even at an accelerating voltage equal to or less than 1 kV. In a case where a thin-film semiconductor element according to the present invention is fabricated, it is necessary to use an ion beam having an energy equal to or less than 2.5 KeV, and therefore the magnetic bucket type ion source is more advantageous, as compared with the rf-plasma type ion source. For example, according to the magnetic bucket type ion source, a time necessary for implanting an impurity ion in the semiconductor film at an accelerating voltage of 1.0 kV and at a dose rate of $5\times10^{15}$ $cm^{-2}$ is less than ten seconds, and thus throughput is very high.

Figure 4:
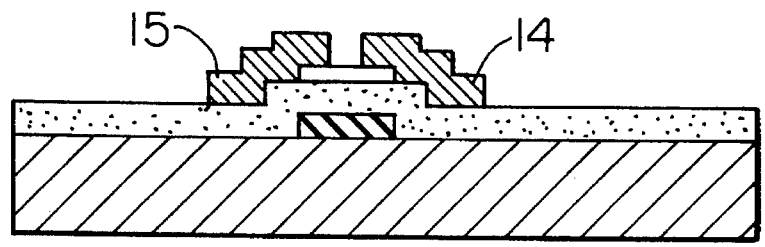
FIG. 4 is a sectional view showing a step of forming source and drain electrodes for the structure of FIG. 3.
Figure 5:
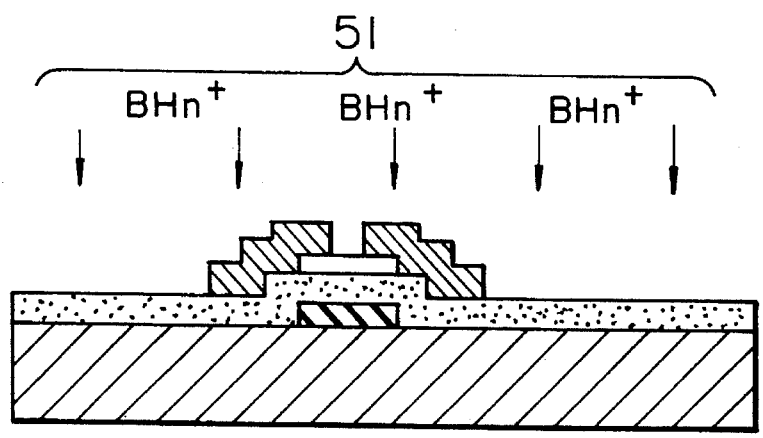
FIG. 5 is a sectional view showing a step of doping that region of the semiconductor film of FIG. 4 which corresponds to a gap between the source electrode and the drain electrode, with a p-type impurity.

Next, molybdenum and aluminum are successively deposited on a surface by the sputtering method, and the metal layer thus obtained is subjected to patterning to form a source electrode 14 and a drain electrode 15 as shown in FIG. 4. Next, as shown in FIG. 5, ion implantation is carried out by using a large-diameter ion beam 51 which is extracted from the plasma of diborane ($B_2H_6$), contains boron ions, and is accelerated at a voltage of 1.0 kV. That is, the structure of FIG. 4 is bombarded with the ion beam so that the boron ions are incident on the structure of FIG. 4 at a dose rate of $5\times10^{15}$ $cm^{-2}$ while keeping the substrate 1 at a temperature of about 200° C. In this case, also, it is preferable to use the magnetic bucket type ion source. Finally, as shown in FIG. 6, an SiN film serving as a passivation film 23 is formed to complete the thin-film semiconductor element.

According to the present embodiment, a conventional step of etching an n-type semiconductor layer is unnecessary, and thus the semiconductor film for forming an active layer can be made small in thickness. Hence, the productivity of the semiconductor film is improved. Further, a reduction in OFF-resistance of TFT due to a photocurrent is suppressed. Thus, when the above thin-film semiconductor element is used in a display device, a high quality image is displayed.

Further, according to the present embodiment, each of the n-type impurity and the p-type impurity is implanted in the semiconductor film by using ion-doping method in low-energy ion beam. Accordingly, the p-type impurity concentration in the semiconductor film can be made equal to the n-type impurity concentration therein, without damaging a channel layer, enhancing characteristics of the device.

Figure 6:
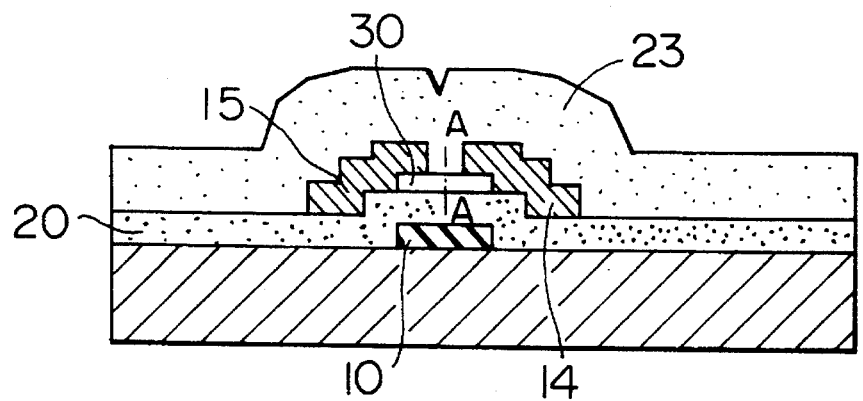
FIG. 6 is a sectional view showing a step of forming an insulating film on the structure of FIG. 5.
Figure 7:
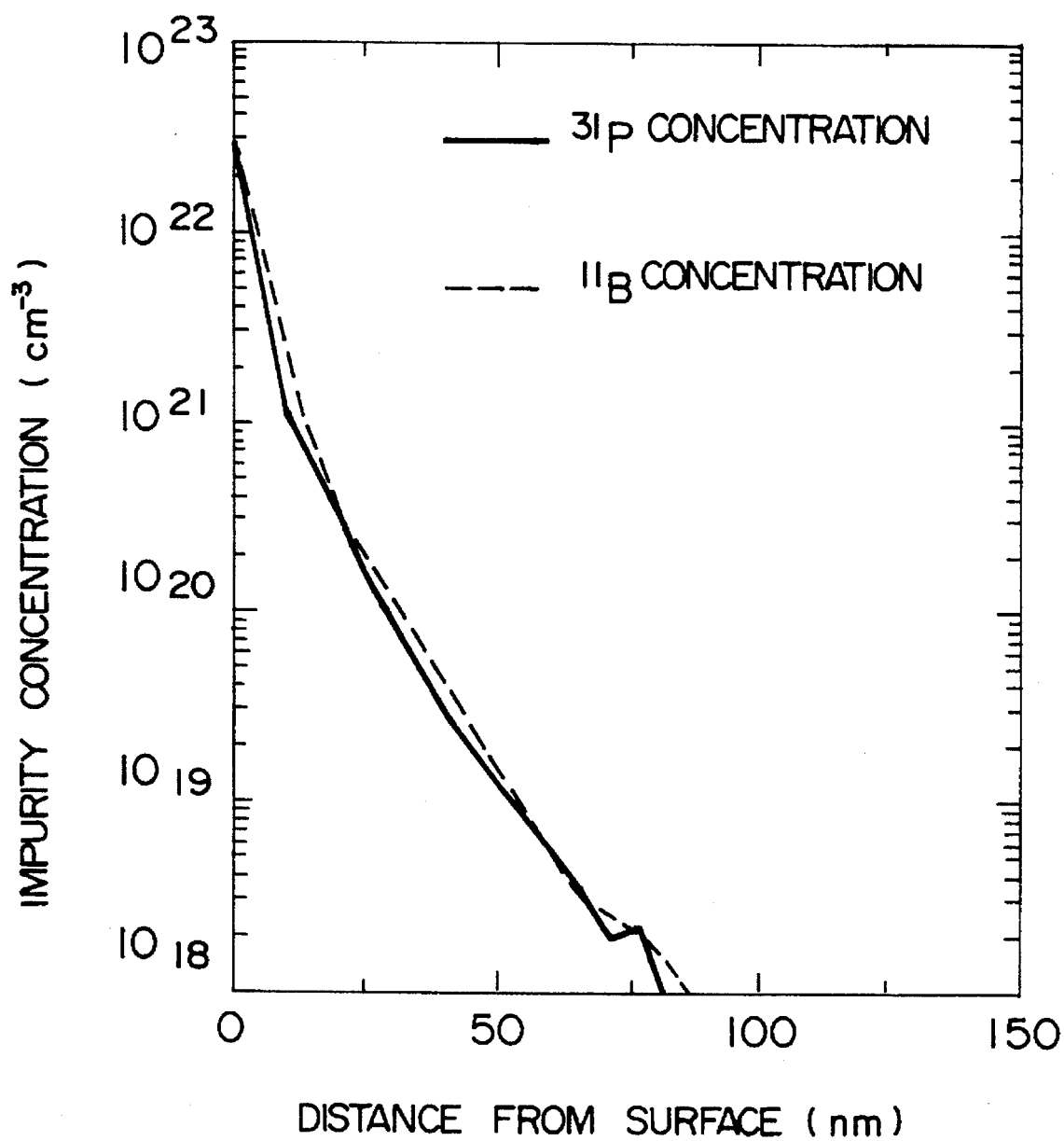
FIG. 7 is a graph showing the impurity concentration distribution in a cross section taken along the line A—A of FIG. 6.

FIG. 7 shows the impurity concentration profile in that region of the hydrogenated amorphous silicon film 30 according to the first embodiment which corresponds to a gap between the source electrode 14 and the drain electrode 15 and serves as a channel region, in the direction of depth (that is, along the line A—A of FIG. 6). As shown in FIG. 7, each of phosphorus concentration and boron concentration is greater than $10^{21}$ $cm^{-3}$ in the neighborhood of the surface of the silicon film 30, decreases exponentially with the depth from the surface, and is reduced to $10^{18}$ $cm^{-3}$ in the neighborhood of the interface between the silicon film 30 and the gate SiN film 20. That is, each of phosphorus and boron has steep concentration distribution. Further, the phosphorus concentration distribution and the boron concentration distribution is substantially coincident with each other. According to experiments of the present inventors, the resistivity of the hydrogenated amorphous silicon film doped with phosphorus and boron is greater than $10^9$ $\Omega cm$, and thus it has been confirmed that two kinds of dopants are compensated with each other. Further, impurity concentration in that part of the silicon film 30 which exists in the neighborhood of the interface between the silicon film 30 and the gate SiN film 20 and serves as a carrier accommodation layer, is very small. Hence, a phosphorus-boron complex deflects are not generated in the above part, and a thin-film semiconductor element having excellent characteristics is obtained.

In a case where the thickness of the hydrogenated amorphous silicon film 30 is less than 20 nm, even when the ion accelerating voltage is made as small as possible, impurity concentration in that part of the silicon film which exists in the neighborhood of the interface between the silicon film 30 and the gate SiN film 20, is greater than $10^{19}$ $cm^{-3}$. Accordingly, the phosphorus-boron complex defects are generated, and the characteristics of the thin-film semiconductor element are degraded. Hence, it is desirable to made the thickness of the hydrogenated amorphous silicon film 30 equal to or greater than 20 nm.

Figure 8:
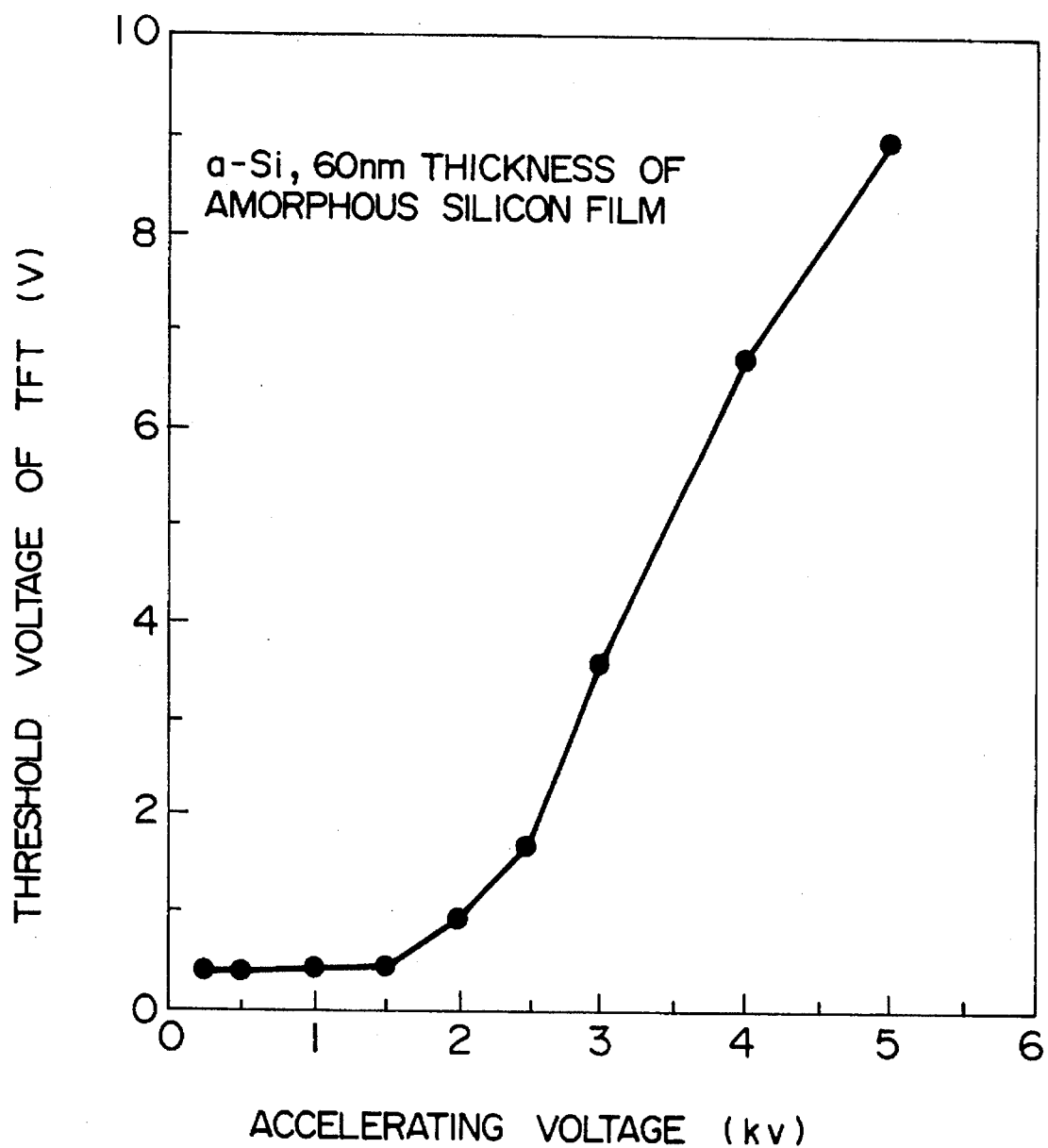
FIG. 8 is a graph showing a relation between the ion accelerating voltage for implanting an impurity ion in the semiconductor film and the threshold voltage of a fabricated TFT.

FIG. 8 shows a relation between a voltage for accelerating a dopant ion and the threshold voltage of a fabricated TFT. As shown in FIG. 8, when the accelerating voltage is made greater than 2.5 kV, the threshold voltage increases abruptly. This is because the hydrogenated morphous silicon film 30 and the gate SiN film are damaged by ion bombardment. Accordingly, it is required to make the accelerating voltage of the dopant ion equal to or less than 2.5 kV, preferably, equal to or less than 1.0 kV.

Figure 9:
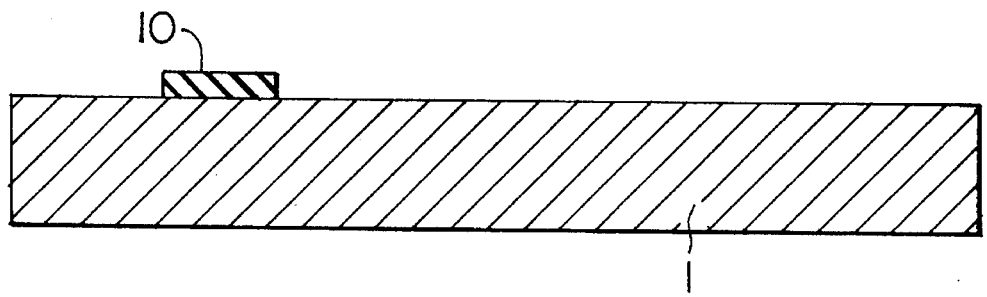
FIG. 9 is a sectional view showing a step of forming a gate electrode of a thin-film semiconductor device according to the present invention.
Figure 10:
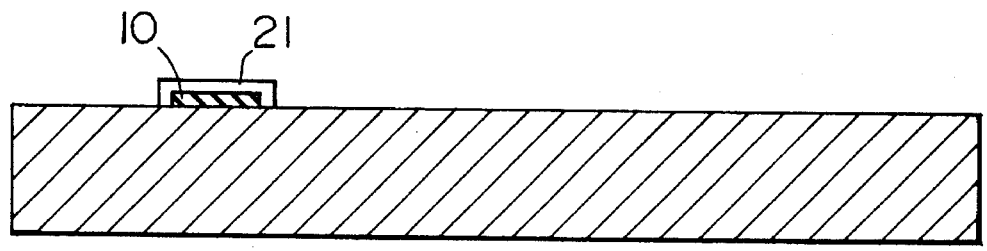
FIG. 10 is a sectional view showing a step of forming an alumina film on the gate electrode of FIG. 9.
Figure 11:
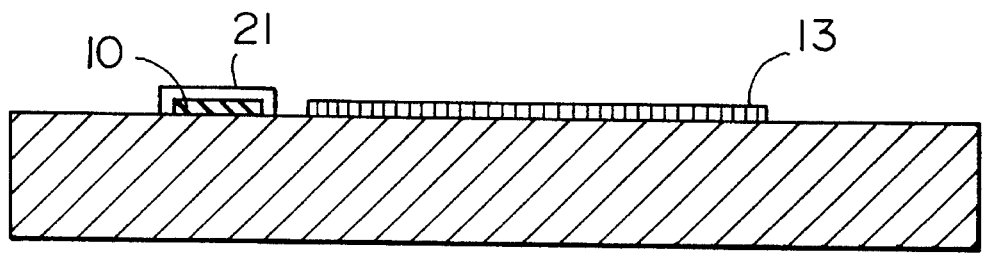
FIG. 11 is a sectional view showing a step of forming a pixel electrode for the structure of FIG. 10.
Figure 12:
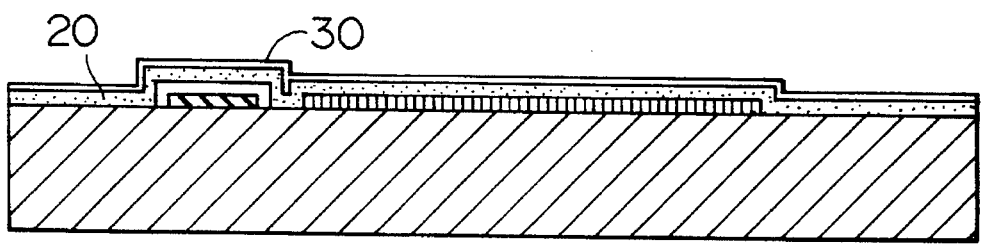
FIG. 12 is a sectional view showing a step of forming a gate insulating film and a semiconductor film, for the structure of FIG. 11.

FIGS. 9 to 16 are sectional views showing the fabrication process of a thin-film semiconductor device according to the second embodiment of the present invention. Referring to FIG. 9, aluminum is deposited on a glass substrate 1 by the sputtering method, and the aluminum film thus obtained is subjected to patterning, to form a gate electrode 10. Next, as shown in FIG. 10, an alumina ($Al_2O_3$) film 21 is formed on the upper and side faces of the gate electrode 10 by the anodic oxidation method. Next, an indium-tin oxide (ITO) film is deposited to a thickness of 100 nm, and is then subjected to patterning, to form a pixel electrode 13 as shown in FIG. 11. Then, as shown in FIG. 12, an SiN film 20 and a hydrogenated amorphous silicon film 30 are successively deposited by the plasma CVD method, to a thickness of 200 nm and a thickness of 60 nm, respectively.

Figure 13:
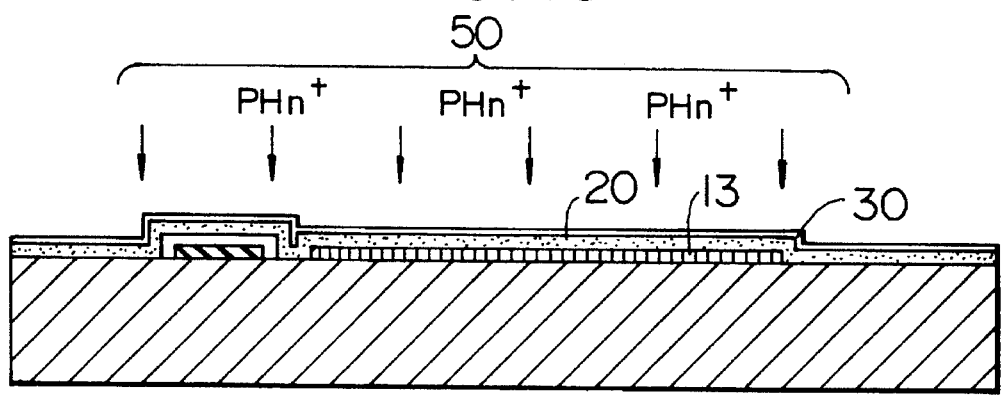
FIG. 13 is a sectional view showing a step of doping the semiconductor film of FIG. 12 with an n-type impurity.
Figure 14:
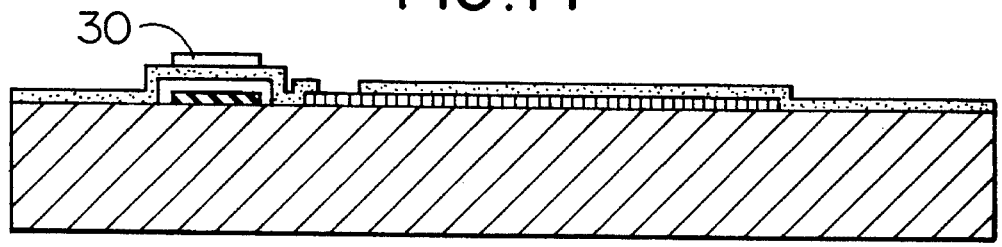
FIG. 14 is a sectional view showing the semiconductor film of FIG. 13 at a time when a predetermined etching process has been completed.
Figure 15:
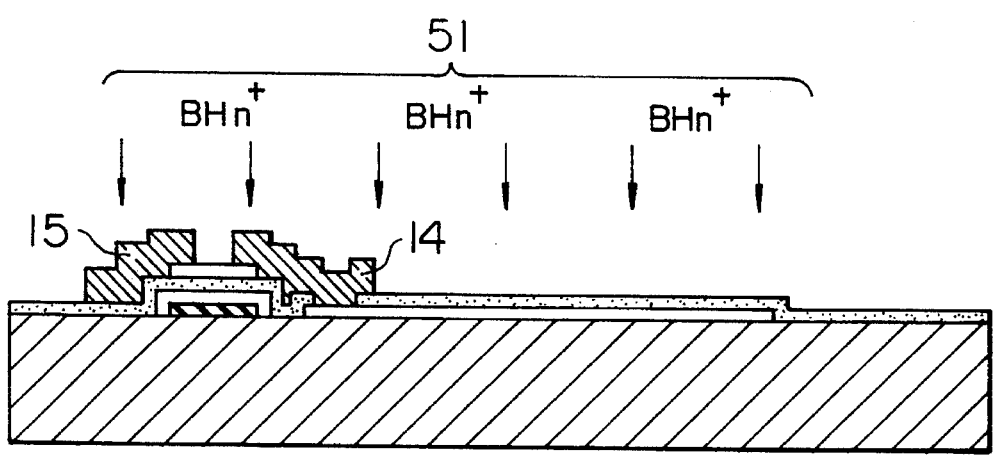
FIG. 15 is a sectional view showing a step of forming source and drain electrodes for the structure of FIG. 14, and doping that region of the semiconductor film which corresponds to a gap between the source electrode and the drain electrode, with a p-type impurity.
Figure 16:
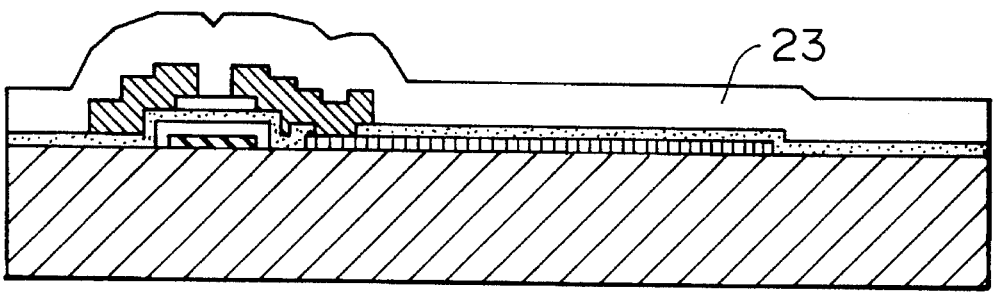
FIG. 16 is a sectional view showing a step of forming an insulating film on the structure of FIG. 15.

Next, as shown in FIG. 13, ion implantation is carried out by using a large-diameter ion beam 50 which is extracted from the plasma of phosphine ($PH_3$) gas contains ions such as $P^+$, $PH^+$ and $PH_2^+$, and is accelerated at a voltage of 1.0 kV. That is, the silicon film is bombarded with the ion beam 50 so that the above ions are incident on the silicon film at a dose rate of $5\times10^{15}$ $cm^{-2}$. Next as shown in FIG. 14 the hydrogenated amorphous silicon film 30 is subjected to patterning so as to have a predetermined shape, and that region of the SiN film 20 which overlies the pixel electrode 13, is partially provided with a through hole. Next, molybdenum and aluminum are successively deposited, and the metal film thus obtained is subjected to patterning to form a source electrode 14 and a drain electrode 15 as shown in. FIG. 15. Further, the structure thus obtained is bombarded with a large-diameter ion beam 51 which is extracted from the plasma of diborane ($B_2H_6$) gas, contains boron ions, and is accelerated at a voltage of 1.0 kV. In more detail, ion implantation using the ion beam 51 is carried out so that the boron ions are incident on the silicon film at a dose rate of $5\times10^{15}$ $cm^{-2}$. Then the structure is subjected to heat treatment at a temperature of 200° to 300° C. for a period of 60 minutes, to activate phosphorus and boron which are implanted in the silicon film. Finally, as shown in FIG. 16, an SiN film serving as a passivation film 23 is formed to complete the TFT active matrix panel for a display device.

The present embodiment can produce the same effect as that obtained by the first embodiment. Moreover, in the present embodiment, the pixel electrode 13 formed of the ITO film is disposed under the SiN film 20. Accordingly, when ion implantation is carried out by using the ion beam 51 which contains boron ions, the pixel electrode 13 is never irradiated directly with the ion beam 51. Thus, the whitening of the pixel electrode 13 due to hydrogen contained in the ion beam is prevented.

Figure 17:
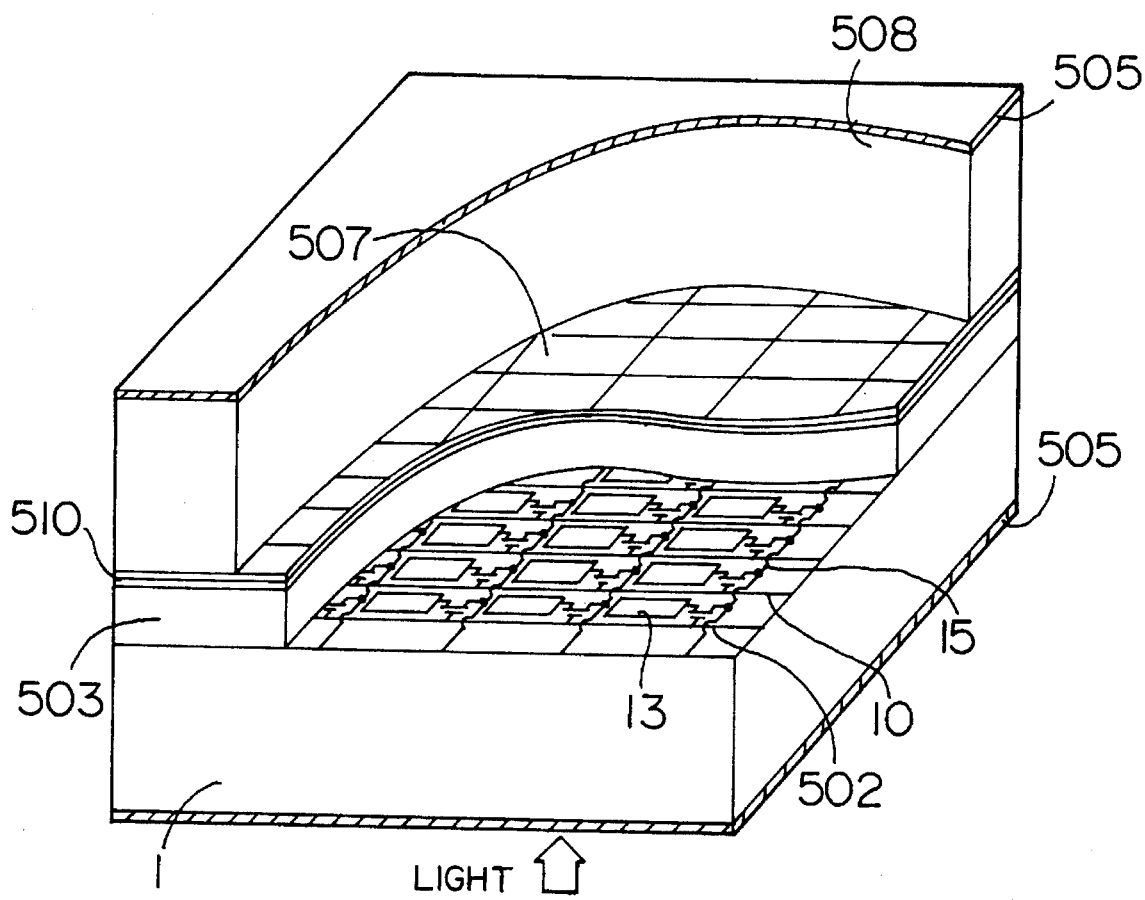
FIG. 17 is a fragmentary, enlarged, perspective view of a liquid crystal display device including a thin-film semiconductor device according to the present invention, with parts cut away for clarity.

A thin-film semiconductor device according to the present invention, as shown in FIG. 17, can be used as a TFT active matrix panel for a liquid crystal display device. Referring to FIG. 17, drain electrodes 15 and gate electrodes 10 are formed on a glass substrate 1 in the form of a matrix, and a TFT 502 according to the present invention is formed in the vicinity of each of the crossing points of the drain electrodes and the gate electrodes, to drive a pixel electrode 13 formed of the ITO film. A counter electrode 510 formed on an ITO film, and a color filter 507 are formed on a glass substrate 508 which is disposed so that a liquid crystal layer 503 is sandwiched between the glass substrates 1 and 508. A pair of polarizing plates 505 are disposed so that the glass substrates 1 and 508 are sandwiched between the polarizing plates. The propagation of light emitted from a light source is controlled in a region corresponding to the pixel electrode 13, to form a color liquid crystal display device of the TFT drive type. In the TFT 502 according to the present invention, the semiconductor film can be made thin, and thus a reduction in OFF-resistance due to a photocurrent can be prevented. Accordingly, the display device can display a high-quality image excellent in contrast ratio. Further, a photo-mask for making the semiconductor film thin is not required, and thus the manufacturing cost of the TFT active matrix panel is reduced.

In the present embodiment, a TFT active matrix panel for a display device has been explained. When the pixel electrode 13 is replaced by a photoconductor formed of an amorphous silicon film or the like, the thin-film semiconductor device according to the second embodiment can be used as an imaging element for reading a picture image.

FIGS. 18 to 25 show the fabrication process of thin-film semiconductor device according to the third embodiment of the present invention. In FIGS. 18 to 25, reference numeral 1 designates a transparent insulating substrate such as a glass substrate, 10 a gate electrode, 20 a gate insulating film, 30 an amorphous silicon film, 14 a source electrode, 15 a drain electrode, 50 and 51 large-diameter ion beams, 13 a transparent pixel electrode, 13a a photoresist pattern, and 23 a protection film.

The above thin-film semiconductor device is fabricated through the following process.

Figure 18:
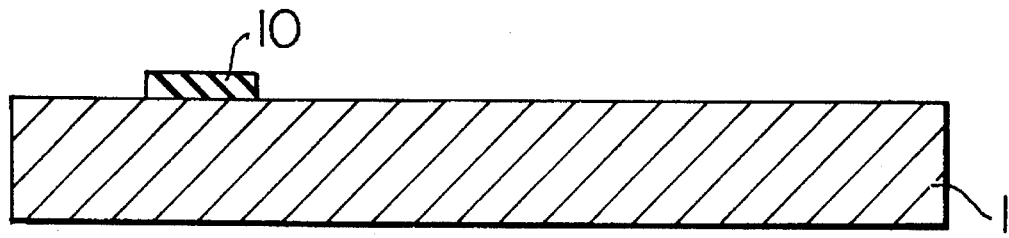
FIG. 18 is a sectional view showing a step of forming a gate electrode of another thin-film semiconductor device according to the present invention.
Figure 19:
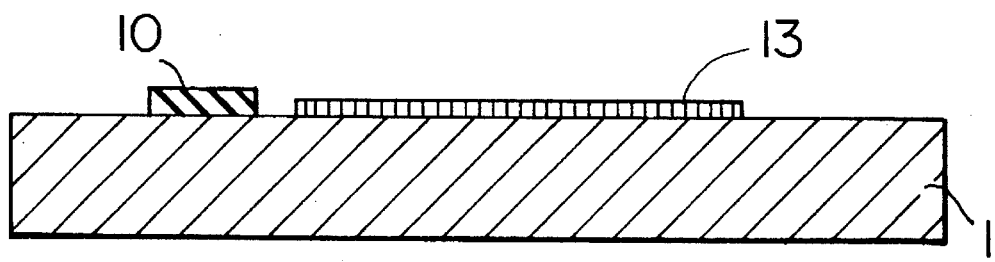
FIG. 19 is a sectional view showing a step of forming a pixel electrode for the structure of FIG. 18.
Figure 20:
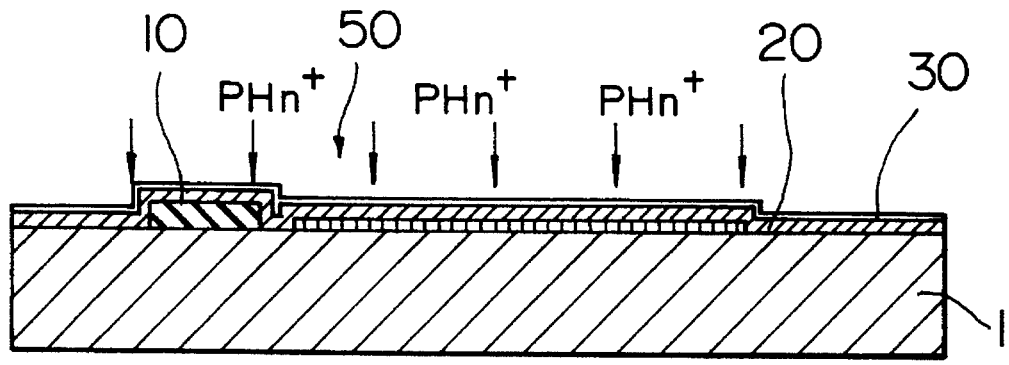
FIG. 20 is a sectional view showing a step of forming agate insulating film and a semiconductor film, for the structure of FIG. 19, and doping the semiconductor film with an n-type impurity.

That is, chromium is first deposited on the glass substrate 1 by the sputtering method. Next, as shown in FIG. 18, the chromium film thus obtained is subjected to patterning so as to have a predetermined shape, thereby forming the gate electrode 10. Next, an ITO film is deposited on a surface by the sputtering method, and is then subjected to patterning so as to have a predetermined shape, thereby forming the transparent pixel electrode 13 as shown in FIG. 19. Then, as shown in FIG. 20, a silicon nitride (SiN) film is deposited on the structure of FIG. 19 to a thickness of 400 nm by the plasma CVD method, to be used as the gate insulating film 20. Further, hydrogenated amorphous silicon is deposited on the gate insulating film 20 to a thicknesses of 60 nm, to form the amorphous silicon film 30. Thereafter, ion implantation is carried out by using the large-diameter ion beam 50 which is extracted from the plasma of phosphine ($PH_3$) gas, contains ions such as $P^+$, $PH^+$ and $PH_2^+$, and is accelerated at a voltage of 1.0 kV. That is, the amorphous silicon film 30 is bombarded with the ion beam 50 so that the above ions are incident on the silicon film 30 at a dose rate of $5\times10^{15}$ $cm^{-2}$, while keeping the glass substrate 1 at a temperature of 200° to 300° C.

In this case, the magnetic bucket type ion source is used for the ion implantation using the ion beam which has low energy and is not subjected to mass separation. The magnetic bucket type ion source has a feature that an ion beam having a large current value can be obtained even when an accelerating voltage equal to or less than 1 kV is used. In order to fabricate the thin-film semiconductor device according to the third embodiment of the present invention, it is necessary to use an ion beam having an every equal to or less than 2.5 KeV. Accordingly, the magnetic bucket type ion source is suited to fabricate the above thin-film semiconductor device. According to the magnetic bucket type ion source, a time necessary for implanting an impurity ion in the semiconductor film at an accelerating of 1.0 kV and at a dose rate of $5\times10^{15}$ $cm^{-2}$ is less than the seconds. Thus, the magnetic bucket type ion source has very high throughput.

Figure 21:
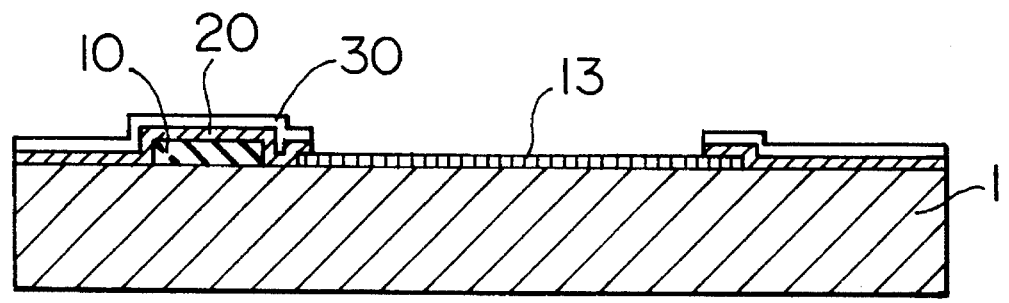
FIG. 21 is a sectional view showing the semiconductor film and gate insulating film of FIG. 20 at a time when a predetermined etching process has been completed.
Figure 22:
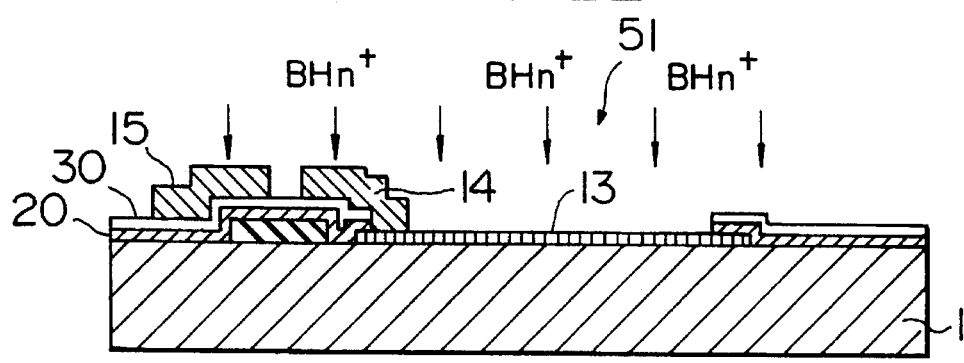
FIG. 22 is a sectional view showing a step of forming source and drain electrodes for the structure of FIG. 21 and doping the semiconductor film with a p-type impurity.
Figure 23:
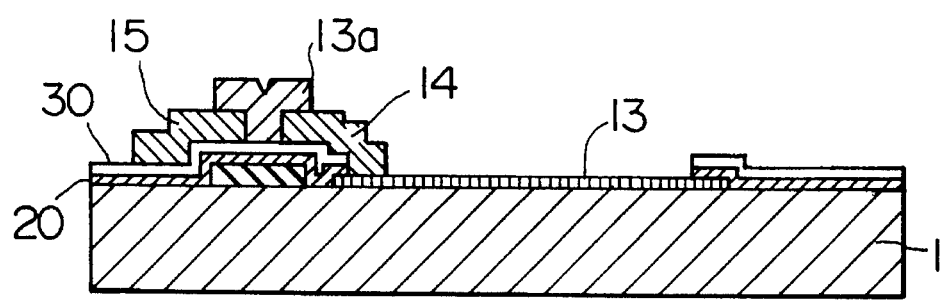
FIG. 23 is a sectional view showing a step of forming a photoresist layer for the structure of FIG. 22.
Figure 24:
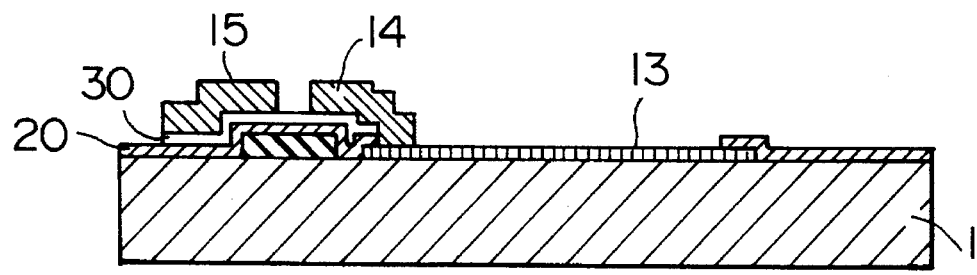
FIG. 24 is a sectional view showing a step of subjecting the semiconductor film of FIG. 23 to patterning by using the photoresist layer, the source electrode and the drain electrode as a mask.
Figure 25:
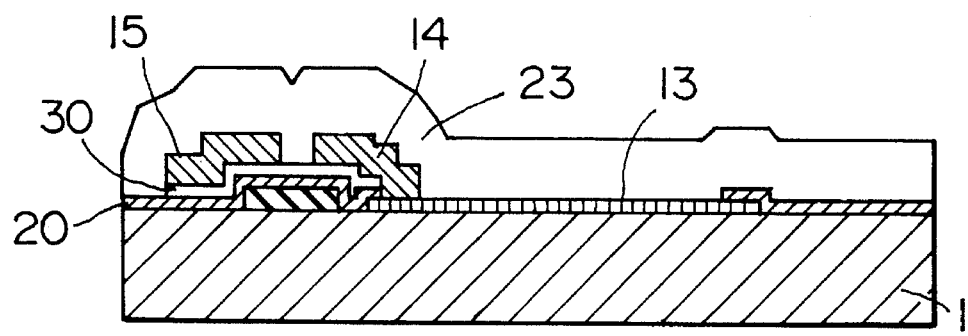
FIG. 25 is a sectional view showing a step of forming an insulating film on the structure of FIG. 24.

Next, a photoresist pattern is formed on the amorphous silicon film 30 by the ordinary photolithographic method, and then the amorphous silicon film 30 and the gate insulating film 20 are etched off by using the photoresist pattern as a mask. FIG. 21 shows a cross section after etching. This etching is carried out by using $SF_6$ or the like as an etching gas, and the amorphous silicon film 30 and the gate insulating film 20 are successively etched. Then, molybdenum and aluminum are successively deposited on the amorphous silicon film 30 and others by the sputtering method and the metal film thus obtained is subjected to patterning so as to have a predetermined pattern, thereby forming the source electrode 14 and the drain electrode 15 as shown in FIG. 22. Thereafter, ion implantation is carried out by using the large-diameter ion beam 51 which is extracted from the plasma of diborone ($B_2H_6$) gas, contains boron ions, and is accelerated at an accelerating voltage of 1.0 kV. That is, the amorphous silicon film 30 and others are bombarded with the ion beam 51 so that the boron ions are incident on the amorphous silicon film 30 at a dose rate of $5\times10^{15}$ $cm^{-2}$, while keeping the glass substrate 1 at a temperature of 200° to 300° C. Like the large-diameter ion beam 50, the ion beam 51 is preferably produced by the magnetic bucket type ion source. Then, as shown in FIG. 23, a predetermined photoresist pattern 13a is formed on the amorphous silicon film 30, the source electrode 14 and the drain electrode 15 by the ordinary lithographic method. Next, as shown in FIG. 24, the amorphous silicon film 30 is subjected to patterning by using the photoresist pattern 13a, the source electrode 14 and the drain electrode 15 as a mask. Finally, as shown in FIG. 25, the protection film 23 made of silicon nitride (SiN) is formed all over the upper face of the structure of FIG. 24, to complete the thin-film semiconductor device including TFT's, that is, a TFT active matrix panel.

In the above fabrication process, only one photoetching step, that is, the step of etching the amorphous silicon film 30 and the gate insulating film 20 selectively by the photolithographic method, is required between the step of forming the gate insulating film 20 and the amorphous silicon film 30 by the plasma CVD method and the step of forming the drain electrode 15 and the source electrode 16. Accordingly, the surface of the amorphous silicon film 30 can be kept sufficiently clean. Thus, the breaking of a wiring conductor due to the stains on residues on the amorphous silicon film 30 is prevented. In the present embodiment, the amorphous silicon film 30 is selectively etched by using the drain electrode 15 and the source electrode 14 at a mask. Accordingly, the amorphous silicon film 30 remains under the drain electrode 15. When the thin-film semiconductor device fabricated by the above method is used for forming a liquid crystal display device, the amorphous silicon film 30 existing under the drain electrode 15 is illuminated directly with light incident on the rear surface of the glass substrate 1. Thus, a photo-current is generated in the amorphous silicon film 30, and there is a fear of reducing the OFF-resistance of a TFT. The photocurrent in the TFT is proportional to the square or cube of the thickness of the amorphous silicon film 30. Accordingly, in order to reduce the photo-current, it is desirable to make the amorphous silicon film 30 thin. In the above-mentioned fabrication method, a conventional step of etching the n-type amorphous silicon layer 30 is omitted. Accordingly, the amorphous silicon film 30 serving as an active layer can be made thin. Thus, a reduction in OFF-resistance of the TFT due to the photo-current generated in the amorphous silicon film 30 can be suppressed, and moreover the productivity of the amorphous silicon film 30 is improved for the reason that the thickness of the film 30 is small.

In the present embodiment, the transparent pixel electrode 13 is formed on the glass substrate 1 immediately after the gate electrode 10 has been formed on the same glass substrate 1. The fabrication method according to the present invention, however, is not limited to the above case, but the pixel electrode 13 may be formed on the glass substrate 1 after the amorphous silicon film 30 and the gate insulating film 20 have been subjected to patterning.

In the present embodiment, the semiconductor film 30 is made of hydrogenated amorphous silicon. The semiconductor film 30 according to the present invention, however, is not limited to the hydrogenated amorphous silicon film, but may be made of a material selected from a group consisting of hydrogenated amorphous SiGe, hydrogenated amorphous SiSn, hydrogenated amorphous SiN, hydrogenated amorphous SiC, and hydrogenated amorphous Ge.

In the present embodiment, at the same time as the amorphous silicon film is doped with an impurity, the glass substrate 1 is heated to a temperature of 200° to 300° C., to activate the impurity. The fabrication method according to the present invention, however, is not limited to such an example, but may be modified as follows. That is, the amorphous silicon film is doped with the impurity without heating the glass substrate 1, and then the glass substrate 1 is heated to a temperature of 200° to 300° C. to activate the impurity.

Further, in the present embodiment, the amorphous silicon film 30 is doped with an impurity by the ion implantation method using an ion beam which is not subjected to mass separation. The ion implantation used in the fabrication method according to the present invention, is not limited to such an example, but may be carried out in the following manner. That is, the glass substrate 1 having the amorphous silicon film 30 may be exposed directly to the plasma of phosphine ($PH_3$) or diborane ($B_2H_6$) gas. In either case, an impurity doped layer having steep impurity concentration distribution can be formed in the amorphous silicon layer 30.

Figure 26:
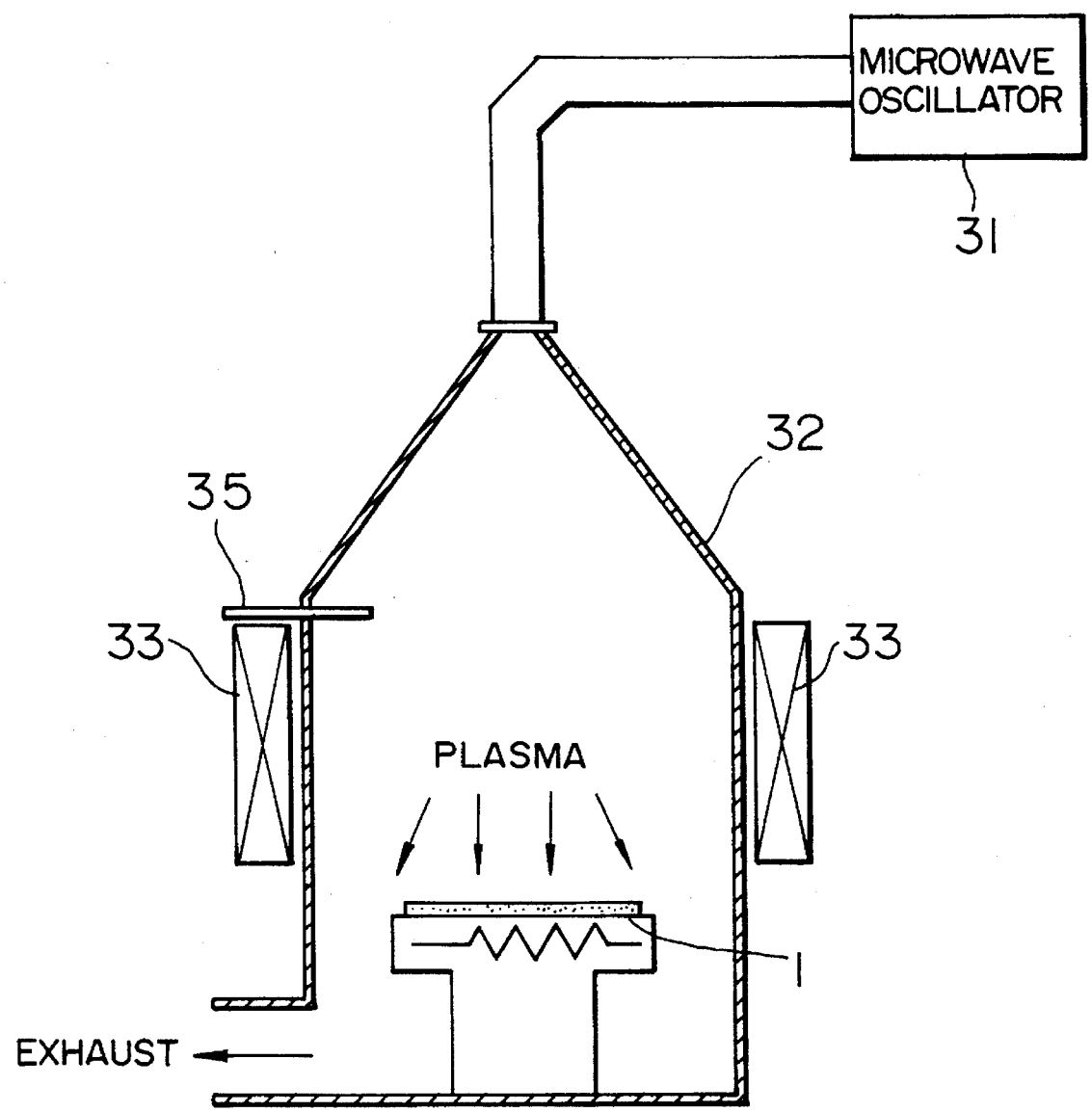
FIG. 26 is a longitudinal sectional view showing an example of a microwave discharge device used for doping the semiconductor film with an impurity.

FIG. 26 is a sectional view showing an example of a microwave discharge device for doping the amorphous silicon film with an impurity by exposing the amorphous silicon film directly to a gas plasma.

In FIG. 26, reference numeral 31 designates a microwave oscillator, 32 a vacuum vessel, 33 a solenoid, 1 a glass substrate having the amorphous silicon film 30 thereon, and 35 a gas inlet.

In this case, the output part of the microwave oscillator 31 is connected to the uppermost part of the vacuum vessel 31 through a waveguide, and the solenoid 33 is disposed along the outer periphery of the vacuum vessel 32. Further, the glass substrate 1 is placed on a table disposed in the vacuum vessel 32.

The outline of the operation of the microwave discharge device is as follows, a phosphine ($PH_3$) or diborane ($B_2H_6$) gas is introduced from the gas inlet 35 into the vacuum vessel 32. Simultaneously with the introduction of the gas, microwave power is supplied from the microwave oscillator 31 into the vacuum vessel 32. Thus, the phosphine or diborane gas is decomposed by discharge, and a microwave plasma is generated in the vacuum vessel 32. In this case, impurity ions in the plasma travel towards the glass substrate 1 along magnetic lines of force generated by the solenoid 33, and are implanted in the amorphous silicon film 30 formed on the glass substrate 1. In the ion implantation method using the microwave discharge, the ion density in the plasma is high, and thus the throughput as to ion implantation is as high as the throughput according to the implantation method using an ion beam which is not subjected to mass separation.

Figure 27:
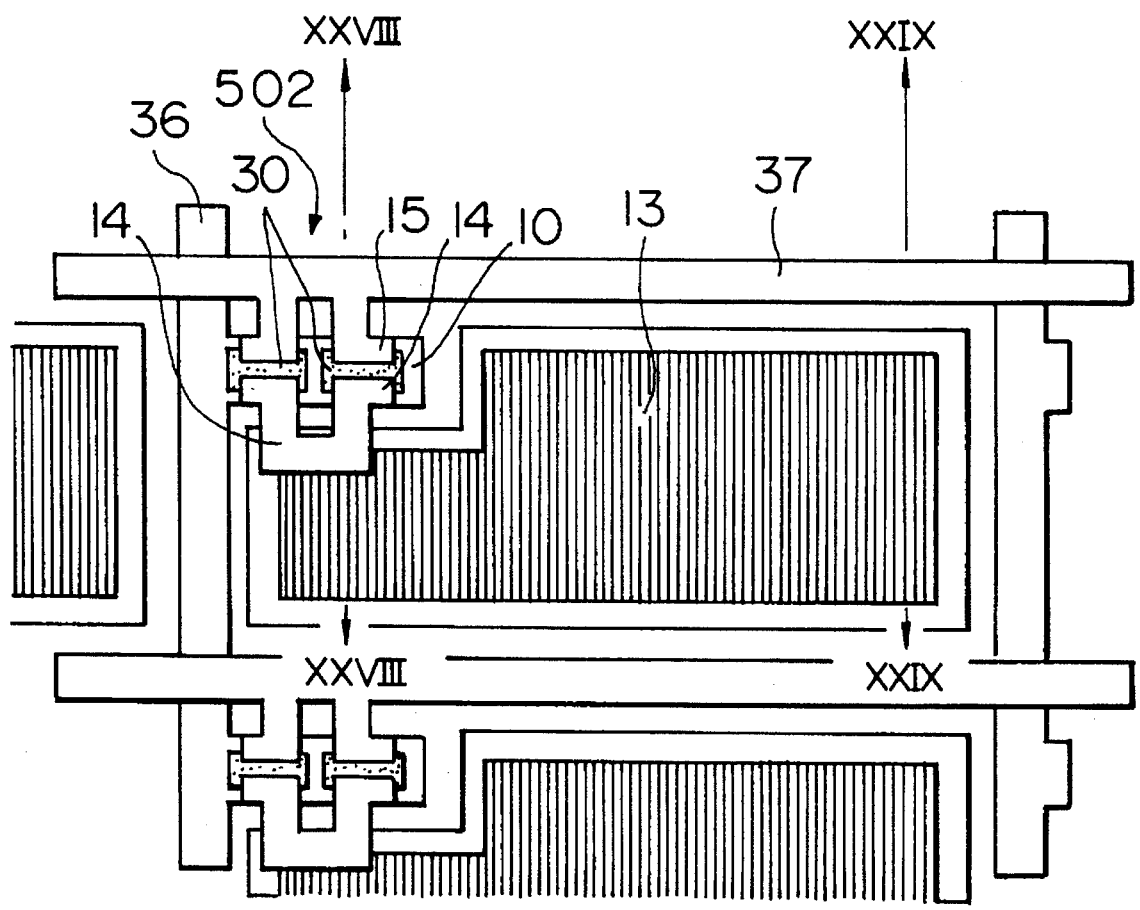
FIG. 27 is an enlarged plan view showing a part of a TFT active matrix panel which is formed of a thin-film semiconductor device according to the present invention.
Figure 28:
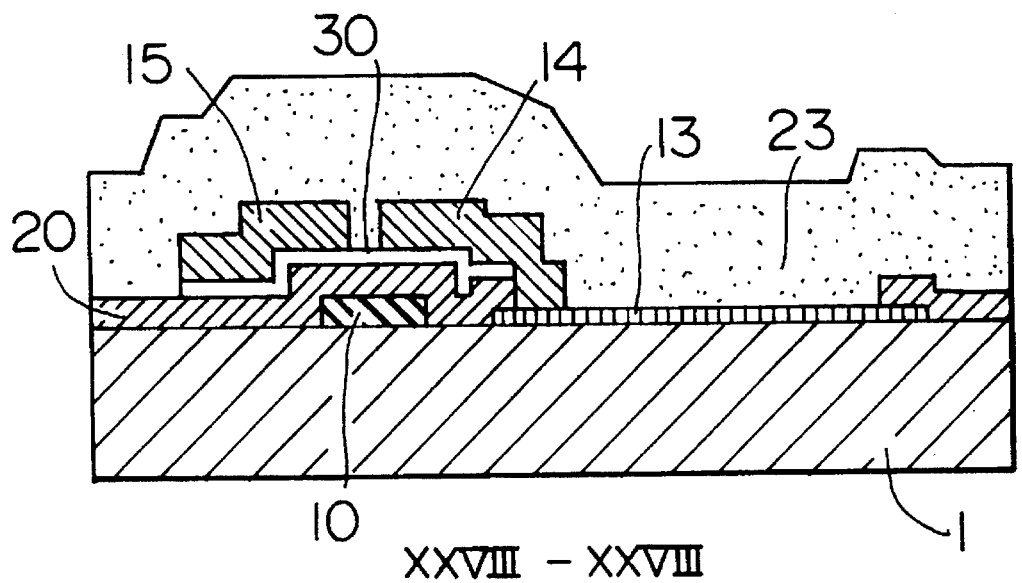
FIG. 28 is a sectional view taken along the line XXVIII—XXVIII of FIG. 27.
Figure 29:
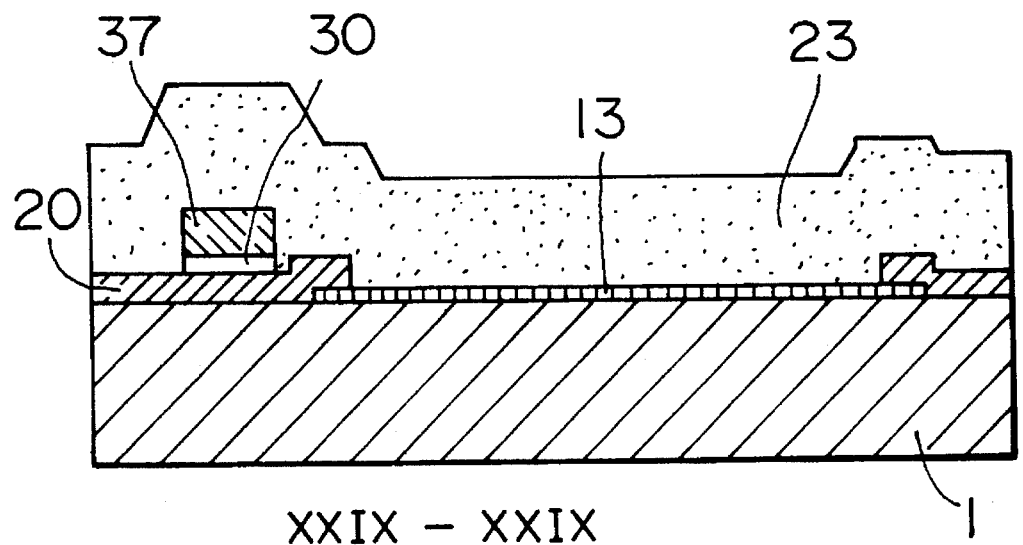
FIG. 29 is a sectional view taken along the line XXIX—XXIX of FIG. 27.

FIGS. 27, 28 and 29 are an enlarged plan view and sectional views showing a part of the above-mentioned TFT active matrix panel. In more detail, FIG. 27 is an enlarged plan view showing a part of a thin-film semiconductor device which is used in a liquid crystal display device having the structure of FIG. 17, FIG. 28 is a sectional view taken along the line XXVIII—XXVIII of FIG. 27, and FIG. 29 is a sectional view taken along the line XXIX—XXIX of FIG. 27.

Referring to FIGS. 27 to 29, the gate electrode 10 of the TFT 502 is formed of a portion projecting from a scanning-signal transmitting electrode line 36, that is, the gate electrode 10 and the scanning-signal transmitting electrode line 36 are formed on the glass substrate 1 at the same time. Further, the drain electrode 15 is formed of a portion projecting from a video-signal transmitting electrode line 37, that is, the video-signal transmitting electrode line 37, the drain electrode 15 and the source electrode 14 are formed over the glass substrate 1 at the same time. Accordingly, as shown in FIG. 29, the amorphous silicon film 30 exists under the video-signal transmitting electrode line 37. Further, the pixel electrode 13 has the form of a rectangle short of a part, and the TFT 502 is disposed in the missing part of the rectangle.

A liquid crystal display device which includes the TFT active matrix panel having the above construction, has been widely used in various fields. Since the operation of the display device is known, explanation thereof will be omitted.

In this case, the thin-film semiconductor device produced by the fabrication method according to the present invention has a feature that the semiconductor film 30 for forming an active layer, as mentioned above, can be made smaller in thickness than the semiconductor film of the conventional semiconductor device, and thus a reduction in OFF-resistance of the semiconductor film 30 due to the photo-current can be prevented. Accordingly, when such a thin-film semiconductor device is used for forming the TFT active matrix panel of a liquid crystal display device, the display device can display a high-quality image excellent in contrast ratio. Further, in the above thin-film semiconductor device, the amorphous silicon film 30 also exists under the video-signal transmitting electrode line 37, and thus a difference in level between the video-signal transmitting electrode line 37 and the drain electrode 15 does not occur. Moreover, since no residue exists on the amorphous silicon film 30, on which the video-signal transmitting electrode line 37 and the drain electrode 15 are to be formed, there is very little probability that the video-signal transmitting electrode line 37 is broken. Thus, the manufacturing yield of the liquid crystal display device is improved, and the manufacturing cost of the active matrix panel can be reduced.

I claim:

1. A thin-film semiconductor element comprising:

a gate electrode formed on an insulating substrate;

an insulating film formed on the gate electrode;

a semiconductor film formed on the insulating film and doped with an n-type impurity, wherein an n-type impurity concentration in the semiconductor film decreases exponentially with a depth from an upper surface of the semiconductor film;

source and drain electrodes formed on the semiconductor film and separated from each other, that region of the semiconductor film corresponding to a gap between the source electrode and the drain electrode, being doped with a p-type impurity so that the p-type impurity concentration decreases exponentially with depth from the upper surface of the semiconductor film and the concentration profile of the p-type impurity in the semiconductor film is nearly equal to that of the n-type impurity in the semiconductor film, to form an intrinsic layer; and a passivation layer covering and in contact with said source and drain electrodes and that portion of said semiconductor film corresponding to the gap between the source electrode- and the drain electrode, said passivation layer containing neither p-type nor n-type impurities therein.

2. A thin-film semiconductor element according to claim 1, wherein a thickness of the semiconductor film lies in a range from 20 to 100 nm.

3. A thin-film semiconductor element according to claim 1, wherein the semiconductor film is made of a material selected from a group consisting of amorphous Si, amorphous SiGe, amorphous Ge, amorphous SiN, amorphous SiC, and amorphous SiSn.

4. A thin-film semiconductor device comprising:

a plurality of thin-film semiconductor elements each having one of a plurality of gate electrodes formed on a transparent insulating substrate in the form of a matrix, an insulating film formed on the gate electrode, a semiconductor film formed on the insulating film and doped with an n-type impurity, wherein an n-type impurity concentration in the semiconductor film decreases exponentially with a depth from an upper surface of the semiconductor film, source and drain electrodes formed on the semiconductor film and separated from each other, that region of the semiconductor film corresponding to a gap between the source electrode and the drain electrode, being doped with a p-type impurity so that the p-type impurity concentration decreases exponentially with depth from the upper surface of the semiconductor film and the concentration profile of the p-type impurity in the semiconductor film is nearly equal to that of the n-type impurity in the semiconductor film, to form an intrinsic layer, and a passivation layer covering and in contact with said source and drain electrodes and that portion of said semiconductor film corresponding to the gap between the source electrode and the drain electrode, said passivation layer containing neither p-type nor n-type impurities therein;

scanning-signal transmitting electrode lines each formed so as to connect the gate electrodes of some of the thin-film semiconductor elements;

video-signal transmitting electrode lines each formed so as to connect the drain electrodes of some of the thin-film semiconductor elements; and pixel electrodes each connected to the source electrode of one of the thin-film semiconductor elements.

5. A thin-film semiconductor device according to claim 4, wherein each of said pixel electrodes is disposed under the insulating film.

6. A thin-film semiconductor device comprising:

a plurality of thin-film semiconductor elements each having one of a plurality of gate electrodes formed on a transparent insulating substrate in the form of a matrix, an insulating film formed on the gate electrode, a semiconductor film formed on the insulating film and doped with an n-type impurity, wherein an n-type impurity concentration in the semiconductor film decreases exponentially with a depth from an upper surface of the semiconductor film, source and drain electrodes formed on the semiconductor film and separated from each other, that region of the semiconductor film corresponding to a gap between the source electrode and the drain electrode, being doped with a p-type impurity so that the p-type impurity concentration decreases exponentially with depth from the upper surface of the semiconductor film and the concentration profile of the p-type impurity in the semiconductor film is nearly equal to that of the n-type impurity in the semiconductor film, to form an intrinsic layer, and a passivation layer covering and in contact with said source and drain electrodes and that portion of said semiconductor film corresponding to the gap between the source electrode and the drain electrode, said passivation layer containing neither p-type nor n-type impurities therein;

scanning-signal transmitting electrode lines each formed so as to connect the gate electrodes of some of the thin-film semiconductor elements;

video-signal transmitting electrode lines each formed so as to connect the drain electrodes of some of the thin-film semiconductor elements; and photoconductors each connected to the source electrode of one of the thin-film semiconductor elements.

7. A thin-film semiconductor device comprising:

scanning-signal transmitting electrode lines and video-signal transmitting electrode lines arranged on a transparent insulating substrate in the form of a grid, the scanning-signal transmitting electrode lines being insulated from the video-signal transmitting electrode lines by an insulating film;

pixel electrodes arranged at the crossing parts of the scanning-signal transmitting electrode lines and the video-signal transmitting electrode lines; and thin-film semiconductor elements arranged at the crossing parts of the scanning-signal transmitting electrode lines and the video-signal transmitting electrode lines, each thin-film semiconductor elements having a gate electrode connected to a scanning-signal transmitting electrode line, a gate insulating layer formed on the gate electrode, a semiconductor film formed on the gate insulating layer and doped with an n-type impurity, wherein an n-type impurity concentration in the semiconductor film decreases exponentially with a depth from an upper surface of the semiconductor film, source and drain electrodes formed on the semiconductor film and separated from each other, the semiconductor film being extended under a video-signal transmitting electrode line so that the extended portion of the semiconductor film and the video-signal transmitting electrode line have the same pattern, the drain electrode being connected to one of the pixel electrodes, that region of the semiconductor film corresponding to a gap between the source electrode and the drain electrode, being doped with a p-type impurity so that the p-type impurity concentration decreases exponentially with depth from the upper surface of the semiconductor film and the concentration profile of the p-type impurity in the semiconductor film is nearly equal to that of the n-type impurity in the semiconductor film, to form an intrinsic layer; and a passivation layer covering and in contact with said source and drain electrodes and that portion of said semiconductor film corresponding to the gap between the source electrode and the drain electrode, said passivation layer containing neither p-type nor n-type impurities therein.

8. A thin-film semiconductor device according to claim 7, wherein each of said pixel electrodes is disposed under portion of the gate insulating film.

9. A thin-film semiconductor element fabricated by a method comprising the steps of:

forming a gate electrode on a transparent insulating substrate;

forming an insulating film on the gate electrode;

forming a semiconductor film on the insulating film;

doping the semiconductor film with an n-type impurity;

forming source and drain electrodes on the semiconductor film so that the source electrode and the drain electrode and separated from each other;

doping that region of the semiconductor film corresponding to a gap between the source electrode and the drain electrode, with a p-type impurity so that the p-type impurity concentration decreases exponentially with depth from an upper surface of the semiconductor film and the concentration profile of the p-type impurity in the semiconductor film is nearly equal to that of the n-type impurity in the semiconductor film; and then forming a passivation layer covering and in contact with said source and drain electrodes and that portion of said semiconductor film corresponding to the gap between the source electrode and the drain electrode, said passivation layer containing neither p-type nor n-type impurities therein;

wherein an ion beam which contains a selected one of the n-type impurity and the p-type impurity and is not subjected to mass separation, is used for doping the semiconductor film with the selected impurity.

10. A thin-film semiconductor element fabricated by a method comprising the steps of:

forming a gate electrode on a transparent insulating substrate;

forming an insulating film on the gate electrode;

forming a semiconductor film on the insulating film;

doping the semiconductor film with an n-type impurity;

forming source and drain electrodes on the semiconductor film so that the source electrode and the drain electrode and separated from each other;

doping that region of the semiconductor film corresponding to a gap between the source electrode and the drain electrode, with a p-type impurity so that the p-type impurity concentration decreases exponentially with depth from an upper surface of semiconductor film and the concentration profile of the p-type impurity the semiconductor film is nearly equal to that of the n-type impurity in semiconductor film; and then forming a passivation layer covering and in contact with said source and drain electrodes and that portion of said semiconductor film corresponding to the gap between the source electrode and the drain electrode, said passivation layer containing neither p-type nor n-type impurities therein wherein an ion beam which contains a selected one of the n-type impurity and the p-type impurity and is not subjected to mass separation, is used for doping the semiconductor film with the selected impurity, and wherein the ion beam which is not subjected to mass separation, contains ions accelerated at the voltage equal to or less than 2,500 V.

11. A thin-film semiconductor element fabricated a the method comprising the steps of:

forming a gate electrode on a transparent insulating substrate;

forming an insulating film on the gate electrode;

forming a semiconductor film on the insulating film;

doping the semiconductor film with an n-type impurity;

forming source and drain electrodes on the semiconductor film so that the source electrode and the drain electrode and separated from each other;

doping that region of the semiconductor film corresponding to a gap between the source electrode and the drain electrode, with a p-type impurity so that the p-type impurity concentration decreases exponentially with depth from an upper surface of semiconductor film and the concentration profile of the p-type impurity the semiconductor film is nearly equal to that of the n-type impurity in semiconductor film; and then forming a passivation layer covering and in contact with said source and drain electrodes and that portion of said semiconductor film corresponding to the gap between the source electrode and the drain electrode, said passivation layer containing neither p-type nor n-type impurities therein;

wherein after the semiconductor film has been doped with the p-type impurity, the doped region of the semiconductor film is subjected to heat treatment at a temperature equal to or less than 300° C., to activate the p-type impurity.

12. A thin-film semiconductor device fabricated by a method comprising the steps of:

forming a plurality of gate electrodes on a transparent insulating substrate in the form of a matrix and forming scanning-signal transmitting electrode lines on the substrate, each scanning-signal transmitting electrode line being formed so as to connect some of the gate electrodes;

forming a first insulating film on each of the gate electrodes;

forming a semiconductor film on the first insulating film;

doping the semiconductor film with an n-type impurity;

forming source and drain electrodes on the semiconductor film so that the source electrode and the drain electrode are separated from each other, and forming pixel electrodes and video-signal transmitting electrode lines, each of the pixel electrodes being connected with one of a plurality of source electrodes, each of the video-signal transmitting electrode lines being formed so as to connect some of a plurality of drain electrodes;

doping that region of the semiconductor film corresponding to a gap between the source electrode and the drain electrode, and other exposed regions of the semiconductor film, with a p-type impurity so that the p-type impurity concentration decreases exponentially with depth from an upper surface of semiconductor film and the concentration profile of the p-type impurity the semiconductor film is nearly equal to that of the n-type impurity in semiconductor film;

forming a second insulating film on a surface including intrinsic layers, the source electrodes, the drain electrodes, and scanning-signal transmitting electrode lines, the video-signal transmitting electrode lines and the pixel electrodes;

subjecting the intrinsic layers to patterning by using the second insulating film, the source electrodes and the drain electrodes as a mask; and then forming a passivation layer covering and in contact with said source and drain electrodes and that portion of said semiconductor film corresponding to the gap between the source electrode and the drain electrode, said passivation layer containing neither p-type nor n-type impurities therein;

wherein in order to dope the semiconductor film with a selected one of the n-type impurity and the p-type impurity, the semiconductor film supported by the transparent insulating substrate, is exposed to a plasma gas which contains the selected impurity.

13. A thin film semiconductor device according to claim 1, wherein said n-type impurity and said p-type impurity are implanted directly into the region of the semiconductor film corresponding to a gap between the source and drain electrodes with an energy equal to or less than 2.5 KeV.

14. A thin film semiconductor device according to claim 1, wherein impurities have not been implanted in or through said passivation layer.

15. A thin film semiconductor device according to claim 4, wherein said n-type impurity and said p-type impurity are implanted directly into the region of the semiconductor film corresponding to a gap between the source and drain electrodes with an energy equal to or less than 2.5 KeV.

16. A thin film semiconductor device according to claim 4, wherein impurities have not been implanted in or through said passivation layer.

17. A thin film semiconductor device according to claim 6, wherein said n-type impurity and said p-type impurity are implanted directly into the region of the semiconductor film corresponding to a gap between the source and drain electrodes with an energy equal to or less than 2.5 KeV.

18. A thin film semiconductor device according to claim 6, wherein impurities have not been implanted in or through said passivation layer.

19. A thin film semiconductor device according to claim 7, wherein said n-type impurity and said p-type impurity are implanted directly into the region of the semiconductor film corresponding to a gap between the source and drain electrodes with an energy equal to or less than 2.5 KeV.

20. A thin film semiconductor device according to claim 7, wherein impurities have not been implanted in or through said passivation layer.

21. A thin film semiconductor device according to claim 9, wherein said n-type impurity and said p-type impurity are implanted directly into the region of the semiconductor film corresponding to a gap between the source and drain electrodes with an energy equal to or less than 2.5 KeV.

22. A thin film semiconductor device according to claim 9, wherein impurities have not been implanted in or through said passivation layer.

23. A thin film semiconductor device according to claim 10, wherein said n-type impurity and said p-type impurity are implanted directly into the region of the semiconductor film corresponding to a gap between the source and drain electrodes with an energy equal to or less than 2.5 KeV.

24. A thin film semiconductor device according to claim 10, wherein impurities have not been implanted in or through said passivation layer.

25. A thin film semiconductor device according to claim 11, wherein said n-type impurity and said p-type impurity are implanted directly into the region of the semiconductor film corresponding to a gap between the source and drain electrodes with an energy equal to or less than 2.5 KeV.

26. A thin film semiconductor device according to claim 11, wherein impurities have not been implanted in or through said passivation layer.

27. A thin film semiconductor device according to claim 12, wherein said n-type impurity and said p-type impurity are implanted directly into the region of the semiconductor film corresponding to a gap between the source and drain electrodes with an energy equal to or less than 2.5 KeV.

28. A thin film semiconductor device according to claim 12, wherein impurities have not been implanted in or through said passivation layer.

* * * * *